(12) United States Patent
Lubert

(10) Patent No.: US 6,379,772 B1
(45) Date of Patent: Apr. 30, 2002

(54) AVOIDING POLYMER FILL OF ALIGNMENT SITES

(75) Inventor: Kenneth J. Lubert, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/344,410

(22) Filed: Jun. 24, 1999

(51) Int. Cl.7 .............................. B32B 3/24; H05K 3/42
(52) U.S. Cl. ...................... 428/131; 428/137; 428/901; 174/261; 174/255; 29/833; 29/852; 427/96; 427/97; 361/777; 361/802
(58) Field of Search .................................. 428/131, 137, 428/901; 174/261, 255; 29/833, 852; 427/96, 97; 361/777, 802

(56) References Cited

U.S. PATENT DOCUMENTS

| 4,674,182 A | 6/1987 | Igarashi | 29/837 |
|---|---|---|---|
| 4,742,431 A | 5/1988 | Igarashi | 361/398 |
| 5,263,243 A | 11/1993 | Taneda et al. | 29/830 |
| 5,451,720 A | 9/1995 | Estes et al. | 174/250 |
| 5,453,913 A | 9/1995 | Koyanagi | 361/813 |
| 5,755,903 A | 5/1998 | Garant et al. | 156/89 |
| 5,779,836 A | 7/1998 | Kerrick | 156/150 |
| 6,016,005 A | * 1/2000 | Cellurosi | 257/703 |

FOREIGN PATENT DOCUMENTS

| FR | 2679241 A1 | 7/1991 |
|---|---|---|
| JP | 6-140729 A | 5/1994 |

* cited by examiner

Primary Examiner—William P. Watkins, III
(74) Attorney, Agent, or Firm—Connolly Bove Lodge & Hutz, LLP; Lawrence R. Fraley

(57) ABSTRACT

A substrate comprising at least one optical fiducial hole and a plurality of holes surrounding at least substantially one-half of the at least one optical fiducial hole.

24 Claims, 2 Drawing Sheets

AVOIDING POLYMER FILL OF ALIGNMENT SITES

TECHNICAL FIELD

The present invention is concerned with a structure for avoiding or eliminating polymer from bleeding into optical fiducial holes on a substrate. The present invention is especially concerned with providing a plurality of holes surrounding at least substantially one half of an optical fiducial hole. This provides for collecting any polymer flowing towards the optical fiducial hole prior to it reaching the hole.

BACKGROUND OF THE INVENTION

In the manufacture of integrated circuit chip carriers, a dielectric sheet material is employed as the substrate, and in many cases is a laminated polymeric substrate of a plurality of layers. In order to provide electrical connection between layers, metal coated through-holes are provided. The plated through-holes are typically filled with a conductive polymeric paste or with polymer from the prepreg used in the lamination to form the dielectric sheet material. Typical compositions include copper-epoxy paste compositions or epoxy resin compositions used in fabricating the prepreg.

It is required that the holes which will be plated and are intended to serve as the functional holes or plated through-holes as well as optical fiducial holes be provided such as by drilling together in order to maintain a true reference during the remainder of the carrier processing.

Furthermore, in order to achieve good optical registration during circuitization, the optical fiducial holes must not become filled with resin composition employed in filling the plated through-holes. However, the optical fiducial holes are in close proximity to various functional holes and therefore a tendency exists for the resin during the hole-fill-lamination process to bleed into the optical fiducial holes. Accordingly, it would be desirable to prevent the resin bleed from filling the optical fiducial holes.

SUMMARY OF THE INVENTION

The present invention makes it possible to avoid or exclude the polymer bleed from filling the optical fiducial holes. In particular, the present invention prevents the optical fiducial holes from being filled with polymer bleed by providing a plurality of holes that surround at least substantially one-half of the optical fiducial hole. This plurality of holes is located between the optical fiducial holes and the functional plated through-holes. Accordingly, this plurality of holes prevents the resin from entering the optical fiducial holes, thereby assuring that automated optical art work registration can be carried out.

Accordingly, one aspect of the present invention relates to a substrate comprising at least one optical fiducial hole and a plurality of holes surrounding at least substantially one-half of the at least one optical fiducial hole.

The present invention also relates to a method for preventing the filling of optical fiducial holes which comprises providing a plurality of holes for use as functional holes and at least one optical fiducial hole in a substrate; providing a plurality of holes surrounding at least substantially one-half of the at least one optical fiducial hole, and being located between the functional holes and the at least one optical fiducial hole. The functional holes are then filled with polymer composition.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures.

Figure 1:
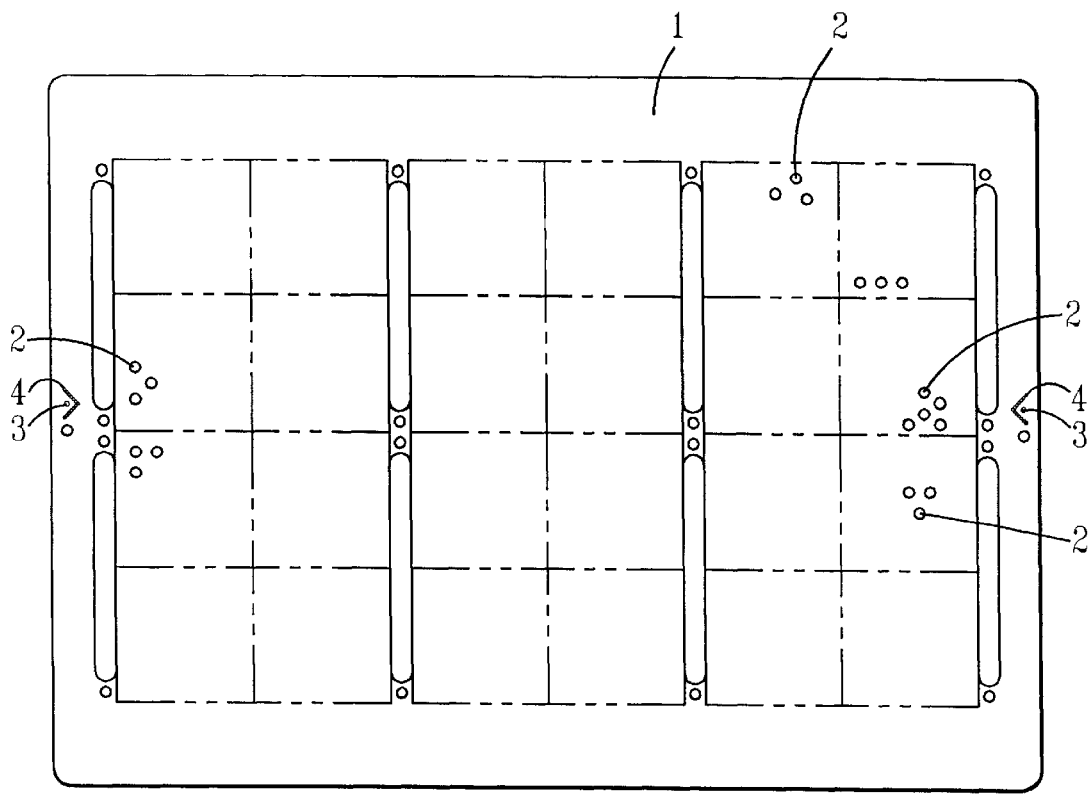
FIG. 1 is a top view illustrating a portion of an integrated circuit chip carrier.

In FIG. 1, numeral 1 refers generally to a laminated circuit board which typically contains a plurality of reinforced polymeric layers. The circuit boards or chip carriers typically are multilayer ultrafine-pitch wire bond circuit boards or plastic ball-grid array laminated chip carriers. Suitable wire bond laminate chip carriers are disclosed for instance in U.S. Pat. Nos. 5,098,766, 4,662,963, 4,427,478, 4,544,801 and 4,855,333, disclosures of which are incorporated herein by reference. A plurality of functional plated through-holes 2 are provided in the laminated panel such as by drilling. Along with drilling the functional holes, optical fiducial holes 3 (also referred to as alignment sites) are likewise drilled or provided by other means. Also surrounding at least one-half of each fiducial hole 3 is a plurality of holes 4 which are located between the functional holes 2 and the optical fiducial holes 3.

Figure 2:
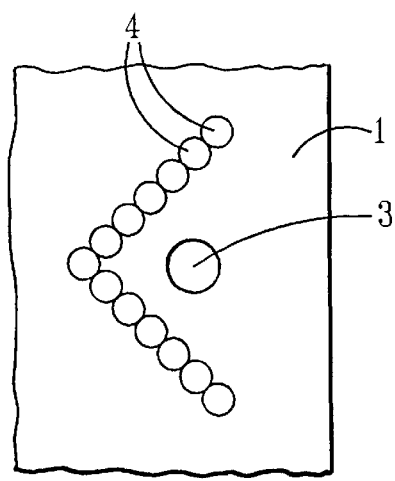
FIG. 2 illustrates an array of holes surrounding an optical fiducial hole according to the present invention.

FIG. 2 illustrates a particular array of a plurality of holes 4 surrounding optical fiducial hole 3. The particular array illustrated in FIG. 2 is a generally V-shaped array whereby the individual holes are in contact with a next adjacent hole. The particular holes illustrated in FIG. 2 are 16 mil diameter holes. The fiducial hole illustrated in FIG. 2 is a 27 mil diameter hole. It is to be noted, however, that these dimensions are merely typical and are non-limiting and have been presented merely for illustrative purposes. In a preferred alignment, the apex or leading edge of the generally V-shaped plurality of holes is aligned with the center of the optical fiducial hole 3.

Figure 3:
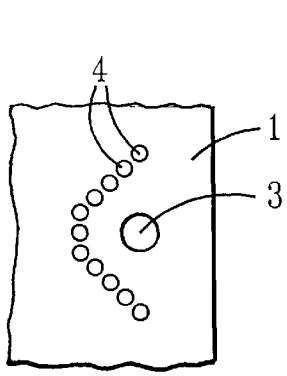
FIG. 3 is an alternative array of holes surrounding an optical fiducial hole according to the present invention.

Reference to FIG. 3 illustrates a still further array of holes 4 surrounding the optical fiducial hole 3. The array illustrated in FIG. 3 is a generally V-shaped array with a flattened or squared off apex. As noted, the individual holes are not in contact with each other but are spaced slightly apart. When spaced slightly apart, the spacing is typically up to about 5 mils and more typically up to about 3 mils. The example illustrated in FIG. 3 includes holes having a diameter of about 8 mils. However, the size is merely typical and is not considered a limiting factor and has been presented merely for illustrative purposes. As noted, the holes surround substantially at least one-half of the optical fiducial hole.

Figure 4:
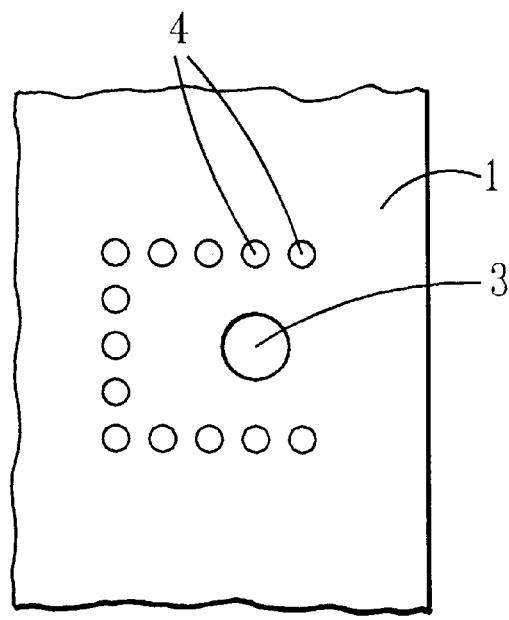
FIG. 4 is another alternative array of holes surrounding an optical fiducial hole according to the present invention.
Figure 5:
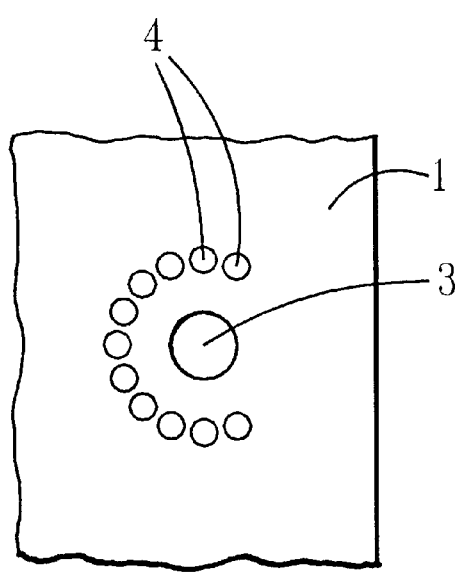
FIG. 5 is a further alternative array of holes surrounding an optical fiducial hole according to the present invention.

Furthermore, it is understood that any configuration of a plurality of holes can be provided such as semicircular or generally U-shaped, if desired. Reference to FIG. 4 illustrates an array of holes 4 surrounding the optical fiducial hole 3 wherein the array is generally U-shaped. Reference to FIG. 5 illustrates an array of holes 4 surrounding the optical fiducial hole 3 wherein the array is substantially semicircular. The size of the holes and their location can be varied provided their location remains between the functional holes and the optical fiducial hole. However, according to preferred aspects, the plurality of holes is provided as close as possible to the fiducial hole and uses up as little real estate of the substrate as possible while performing its function of protecting the fiducial hole from being filled with polymer used in filling the functional holes in the substrate.

Typical polymer composition used to fill the holes includes conductive polymer compositions such as copper-epoxy resin compositions or epoxy composition used in creating prepregs used to form the laminated substrate. During hole fill or lamination processing, the resin will bleed and be captured by the plurality of holes 4 before being able to reach and fill the fiducial holes 3.

Examples of chip carriers commonly employed are referred to as flip-chip, cavity-chip carrier and chip-up. The flip-chip technique refers to having an integrated circuit chip attached directly to a chip-carrier by means of solder ball reflow. The attachment occurs via solder balls on the chip to C4 pads on the chip-carrier. In the cavity chip carrier technique, a cut-out is provided in the chip-carrier for accommodating the chip. Electrical connection from the chip to the carrier is made with wire bands employing, for instance, ultra-sonic bonding. The chip and wire bonds are encapsulated with a dielectric. In the chip-up configuration, the chip is mounted on the surface of the carrier. Electrical connection from the chip to the carrier is made with wire bonds employing, for instance, ultra-sonic bonding. The chip and wire bonds are encapsulated with a dielectric.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A substrate comprising functional holes and at least one optical fiducial hole and a plurality of holes surrounding at least substantially one-half of the at least one optical fiducial hole,
wherein said substrate is a laminated polymeric substrate comprising a plurality of layers;
and wherein the plurality of holes is located between the functional holes and the at least one optical fiducial hole.

2. The substrate of claim 1 wherein the plurality of holes is V-shaped.

3. The substrate of claim 1 wherein the plurality of holes is V-shaped having a flattened apex.

4. The substrate of claim 1 wherein the plurality of holes is U-shaped.

5. The substrate of claim 1 wherein the plurality of holes is semicircular.

6. The substrate of claim 1 wherein each hole of the plurality of holes contacts an adjacent hole.

7. The substrate of claim 1 wherein the holes of the plurality of holes are spaced apart from each other.

8. The substrate of claim 7 wherein the holes of the plurality of holes are spaced apart by up to 5 mils from each other.

9. The substrate of claim 7 wherein each hole of the plurality of holes is spaced apart by up to 3 mils from each other.

10. The substrate of claim 1 wherein the functional holes are filled with resin composition.

11. The substrate of claim 10 wherein the resin composition is a copper-epoxy composition.

12. The substrate of claim 1 being an integrated circuit chip carrier.

13. A method for avoiding the filling of optical fiducial holes which comprises providing a plurality of holes which are to subsequently serve as functional holes and at least one fiducial hole in a substrate; wherein said substrate is a laminated polymeric substrate comprising a plurality of layers;
providing a plurality of holes surrounding the at least substantially one-half of the at least one optical fiducial hole;
and locating the plurality of holes between the functional holes and the at least one optical fiducial hole; and
filling the functional holes with a polymer composition.

14. The method of claim 13 wherein the plurality of holes is V-shaped.

15. The method of claim 13 wherein the plurality of holes is V-shaped having a flattened apex.

16. The method of claim 13 wherein the plurality of holes is U-shaped.

17. The method of claim 13 wherein the plurality of holes is semicircular.

18. The method of claim 13 wherein each hole of the plurality of holes contacts an adjacent hole.

19. The method of claim 13 wherein each hole of the plurality of holes is spaced apart from each other.

20. The method of claim 19 wherein the holes of the plurality of holes are spaced apart by up to 5 mils from each other.

21. The method of claim 19 wherein the holes of the plurality of holes are spaced apart by up to 3 mils from each other.

22. The method of claim 13 wherein the functional holes, the at least one fiducial hole and plurality of holes are provided by drilling.

23. The method of claim 13 wherein the polymer composition is a copper-epoxy composition.

24. The method of claim 13 wherein the substrate is an integrated circuit chip carrier.

* * * * *